(12) United States Patent
Lee et al.

(10) Patent No.: US 10,937,363 B2
(45) Date of Patent: Mar. 2, 2021

(54) PIXEL OF AN ORGANIC LIGHT EMITTING DIODE DISPLAY DEVICE, AND ORGANIC LIGHT EMITTING DIODE DISPLAY DEVICE

(71) Applicant: Samsung Display Co., Ltd., Yongin-Si (KR)

(72) Inventors: Hyo-Chul Lee, Hwaseong-si (KR); Hongbo Kim, Seoul (KR); Yoonjung Chai, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/270,945

(22) Filed: Feb. 8, 2019

(65) Prior Publication Data

US 2019/0251899 A1 Aug. 15, 2019

(30) Foreign Application Priority Data

Feb. 12, 2018 (KR) .......................... 10-2018-0017161

(51) Int. Cl.
*G09G 3/3233* (2016.01)
*G09G 3/3266* (2016.01)
*H01L 27/32* (2006.01)

(52) U.S. Cl.
CPC ......... *G09G 3/3233* (2013.01); *G09G 3/3266* (2013.01); *H01L 27/3262* (2013.01); *H01L 27/3265* (2013.01); *G09G 2300/0842* (2013.01); *G09G 2310/08* (2013.01); *G09G 2320/0233* (2013.01); *G09G 2330/028* (2013.01)

(58) Field of Classification Search
CPC ............ H01L 27/3265; H01L 27/3262; G09G 3/3266; G09G 2300/0819; G09G 3/3233; G09G 3/3258; G09G 2320/0233; G09G 2300/0852; G09G 2330/028
See application file for complete search history.

(56) References Cited

U.S. PATENT DOCUMENTS

| | | | | |
|---|---|---|---|---|
| 2001/0054711 A1* | 12/2001 | Numao | ................. | G09G 3/3258 257/72 |
| 2006/0208971 A1* | 9/2006 | Deane | .................. | G09G 3/3233 345/76 |
| 2014/0092144 A1* | 4/2014 | Kim | ...................... | G09G 3/3233 345/690 |
| 2015/0294625 A1* | 10/2015 | Lee | ....................... | G09G 3/3233 345/691 |
| 2018/0018918 A1* | 1/2018 | Miyake | .................... | G09G 3/36 |
| 2018/0357959 A1* | 12/2018 | Xiang | .................. | G09G 3/3233 |

FOREIGN PATENT DOCUMENTS

KR 1020070004394 A 1/2007

* cited by examiner

*Primary Examiner* — Abbas I Abdulselam
(74) *Attorney, Agent, or Firm* — Cantor Colburn LLP

(57) ABSTRACT

A pixel of an organic light emitting diode display device includes a switching transistor which transfers a data voltage in response to a scan voltage applied thereto through a scan line, a storage capacitor which stores the data voltage transferred by the switching transistor, a driving transistor which generates a driving current based on the data voltage stored in the storage capacitor, an organic light emitting diode which emits light based on the driving current, and an anode discharging capacitor connected between the scan line and an anode of the organic light emitting diode.

20 Claims, 8 Drawing Sheets

PIXEL OF AN ORGANIC LIGHT EMITTING DIODE DISPLAY DEVICE, AND ORGANIC LIGHT EMITTING DIODE DISPLAY DEVICE

This application claims priority to Korean Patent Application No. 10-2018-0017161, filed on Feb. 12, 2018, and all the benefits accruing therefrom under 35 U.S.C. § 119, the content of which in its entirety is herein incorporated by reference.

BACKGROUND

1. Field

Exemplary embodiments relate generally to a display device. More particularly, exemplary embodiments relate to a pixel of an organic light emitting diode display device, and the organic light emitting diode display device including the pixel.

2. Description of the Related Art

Each pixel of an organic light emitting diode ("OLED") display device may include a plurality of transistors and wirings for data writing, OLED driving, threshold voltage compensation, emission control, driving transistor initialization, OLED initialization, storage capacitor initialization, for example. Structures associated with the transistors and wirings may limit size reduction of a pixel and/or may limit resolution increase of a display device that includes the pixel.

SUMMARY

Some exemplary embodiments provide a pixel of an organic light emitting diode display device capable of discharging an anode of an organic light emitting diode without an additional transistor provided for discharging the anode.

Some exemplary embodiments provide an organic light emitting diode display device including a pixel capable of discharging an anode of an organic light emitting diode without an additional transistor provided for discharging the anode.

According to an exemplary embodiment, a pixel of an organic light emitting diode display device includes a switching transistor which transfers a data voltage in response to a scan voltage applied thereto through a scan line, a storage capacitor which stores the data voltage transferred thereto by the switching transistor, a driving transistor which generates a driving current based on the data voltage stored in the storage capacitor, an organic light emitting diode which emits light based on the driving current, and an anode discharging capacitor connected between the scan line and an anode of the organic light emitting diode.

In an exemplary embodiment, the scan voltage may have a turn-on voltage level while the data voltage is stored in the storage capacitor in a data writing period, the scan voltage may be changed from the turn-on voltage level to a first turn-off voltage level after the data voltage is stored in the storage capacitor in the data writing period, and the scan voltage may be further changed from the first turn-off voltage level to a second turn-off voltage level at a start time point of an emission period.

In an exemplary embodiment, the second turn-off voltage level may be lower than the first turn-off voltage level.

In an exemplary embodiment, a voltage of the anode of the organic light emitting diode may be decreased at the start time point of the emission period based on a coupling between the scan line and the anode of the organic light emitting diode by the anode discharging capacitor.

In an exemplary embodiment, the voltage of the anode of the organic light emitting diode may be decreased lower than a threshold voltage of the organic light emitting diode at the start time point of the emission period.

In an exemplary embodiment, the pixel may have a two-transistor-two-capacitor ("2T2C") structure with the switching transistor, the driving transistor, the storage capacitor and the anode discharging capacitor.

In an exemplary embodiment, the organic light emitting diode may be connected to the driving transistor and a low power supply voltage line. In such an embodiment, a low power supply voltage supplied through the low power supply voltage line may have a voltage level substantially the same as a voltage level of a high power supply voltage in a data writing period, and may be changed to a ground voltage in an emission period.

According to another exemplary embodiment, there is provided a pixel of an organic light emitting diode display device including a switching transistor including a source connected to a data line, a drain, and a gate connected to a scan line, a storage capacitor connected between a first power supply voltage line and the drain of the switching transistor, a driving transistor including a source connected to the first power supply voltage line, a drain, and a gate connected to the storage capacitor, an organic light emitting diode including an anode connected to the drain of the driving transistor, and a cathode connected to a second power supply voltage line, and an anode discharging capacitor connected between the scan line and the anode of the organic light emitting diode.

In an exemplary embodiment, a scan voltage applied to the scan line may be changed from a first turn-off voltage level to a second turn-off voltage level at a start time point of an emission period.

In an exemplary embodiment, the second turn-off voltage level may be lower than the first turn-off voltage level.

In an exemplary embodiment, a voltage of the anode of the organic light emitting diode may be decreased at the start time point of the emission period based on a coupling between the scan line and the anode of the organic light emitting diode by the anode discharging capacitor.

In an exemplary embodiment, the voltage of the anode of the organic light emitting diode may be decreased lower than a threshold voltage of the organic light emitting diode at the start time point of the emission period.

In an exemplary embodiment, the pixel may have a 2T2C structure with the switching transistor, the driving transistor, the storage capacitor and the anode discharging capacitor.

In an exemplary embodiment, a second power supply voltage supplied through the second power supply voltage line may have a voltage level substantially the same as a voltage level of a first power supply voltage supplied through the first power supply voltage line in a data writing period, and the second power supply voltage may be changed to a ground voltage in an emission period.

According to another exemplary embodiment, there is provided an organic light emitting diode display device including a display panel including a plurality of pixels, a data driver which provides a data voltage to each of the plurality of pixels, a scan driver which provides a scan voltage to each of the plurality of pixels, and a timing controller which controls the data driver and the scan driver.

Each of the plurality of pixels includes a switching transistor which transfers the data voltage in response to the scan voltage applied thereto through a scan line, a storage capacitor which stores the data voltage transferred by the switching transistor, a driving transistor which generates a driving current based on the data voltage stored in the storage capacitor, an organic light emitting diode which emits light based on the driving current, and an anode discharging capacitor connected between the scan line and an anode of the organic light emitting diode.

In an exemplary embodiment, the organic light emitting diode display device may further include a power supply unit which supplies a first power supply voltage and a second power supply voltage to the display panel, and supplies a gate on voltage and a gate off voltage to the scan driver. In such an embodiment, in a data writing period, the power supply unit may supply the first and second power supply voltages having substantially a same voltage level to the display panel. In such an embodiment, at a start time point of an emission period, the power supply unit may change the second power supply voltage in a way such that the first and second power supply voltages have different voltage levels from each other, and may change the gate off voltage from a first turn-off voltage level to a second turn-off voltage level.

In an exemplary embodiment, the second turn-off voltage level may be lower than the first turn-off voltage level.

In an exemplary embodiment, the scan driver may output the scan voltage having a turn-on voltage level based on the gate on voltage while the data voltage is stored in the storage capacitor in a data writing period. In such an embodiment, the scan driver may output the scan voltage having the first turn-off voltage level based on the gate off voltage having the first turn-off voltage level after the data voltage is stored in the storage capacitor in the data writing period. In such an embodiment, the scan driver may output the scan voltage having the second turn-off voltage level based on the gate off voltage having the second turn-off voltage level in the emission period.

In an exemplary embodiment, a voltage of the anode of the organic light emitting diode may be decreased at the start time point of the emission period based on a coupling between the scan line and the anode of the organic light emitting diode by the anode discharging capacitor.

In an exemplary embodiment, the organic light emitting diode display device may further include a power supply unit which supply a power supply voltage to the plurality of pixels through a plurality of power supply voltage lines spaced apart from each other, and a current sensing unit which detect sensing currents through the plurality of power supply voltage lines, where the sensing currents may be generated by the plurality of pixels when a sensing voltage is applied as the data voltage.

In exemplary embodiments, as described above, the pixel of the organic light emitting diode display device and the organic light emitting diode device may include an anode discharging capacitor connected between a scan line and an anode of an organic light emitting diode, and may decrease a voltage of the anode at a start time point of an emission period based on a coupling between the scan line and the anode by the anode discharging capacitor, thereby effectively preventing undesired light emission of the pixel.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
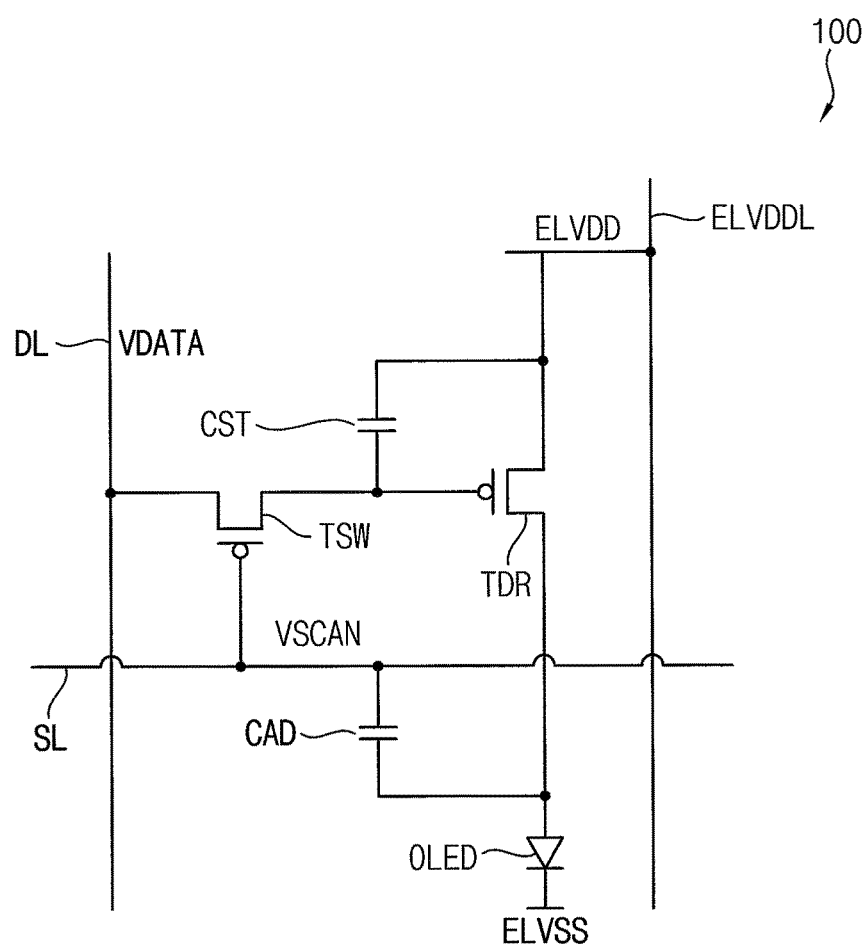
FIG. 1 is a circuit diagram illustrating a pixel of an organic light emitting diode display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, "as least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be described in detail with reference to the accompanying drawings.

FIG. 1 is a circuit diagram illustrating a pixel of an organic light emitting diode display device according to an exemplary embodiment.

Referring to FIG. 1, a pixel 100 of an organic light emitting diode display device may include a switching transistor TSW, a storage capacitor CST, a driving transistor TDR, an organic light emitting diode OLED and an anode discharging capacitor CAD. In an exemplary embodiment, as illustrated in FIG. 1, the pixel 100 may have a two-transistor-two-capacitor ("2T2C") structure including only two transistors of the switching transistor TSW and the driving transistor TDR and only two capacitors of the storage capacitor CST and the anode discharging capacitor CAD. That is, the total number of the transistors in the pixel 100 having the 2T2C structure is two, and the total number of the capacitors in the pixel 100 having the 2T2C structure is two.

The switching transistor TSW may transfer a data voltage VDATA of a data line DL to the storage capacitor CST in response to a scan voltage VSCAN applied to a scan line SL.

In an exemplary embodiment, the switching transistor TSW may include a source connected to the data line DL, a drain connected to the storage capacitor CST, and a gate connected to the scan line SL.

The storage capacitor CST may be connected between a first power supply voltage line ELVDDL, to which a first power supply voltage (e.g., a high power supply voltage) ELVDD is applied, and the drain of the switching transistor TSW. The storage capacitor CST may store the data voltage VDATA transferred by the switching transistor TSW at a second electrode thereof. In an exemplary embodiment, the storage capacitor CST may include a first electrode connected to the first power supply voltage line ELVDDL, and the second electrode connected to the drain of the switching transistor TSW.

The driving transistor TDR may generate a driving current based on the data voltage VDATA stored in the storage capacitor CST. In an exemplary embodiment, the driving transistor TDR may include a source connected to the first power supply voltage line ELVDDL, a drain connected to the organic light emitting diode OLED, and a gate connected to the storage capacitor CST.

The organic light emitting diode OLED may emit light based on the driving current generated by the driving transistor TDR. In an exemplary embodiment, the organic light emitting diode OLED may include an anode connected to the drain of the driving transistor TDR, and a cathode connected to a second power supply voltage line, to which a second power supply voltage (e.g., a low power supply voltage) ELVSS.

The anode discharging capacitor CAD may be connected between the scan line SL and the anode of the organic light emitting diode OLED. In an exemplary embodiment, the anode discharging capacitor CAD may include a first electrode connected to the scan line SL, and a second electrode connected to the anode of the organic light emitting diode OLED.

In an exemplary embodiment, the first power supply voltage line ELVDDL for supplying the first power supply voltage ELVDD may be formed in an integral (or unitary) structure and connected to all of the pixels 100 included in the organic light emitting diode display device. In one exemplary embodiment, for example, the first power supply voltage line ELVDDL may have a mesh structure for supplying the first power supply voltage ELVDD to all the pixels 100. In an alternative exemplary embodiment, the first power supply voltage ELVDD may be supplied to the pixels 100 through a plurality of power supply voltage lines spaced apart from each other. In one exemplary embodiment, for example, the first power supply voltage line ELVDDL for supplying the first power supply voltage ELVDD to the pixel 100 may be one of the plurality of power supply voltage lines extending in parallel with the data lines DL.

In an exemplary embodiment, the second power supply voltage line for supplying the second power supply voltage ELVSS may be formed in an integral (or unitary) structure and connected to all of the pixels 100. In one exemplary embodiment, for example, the second power supply voltage line may have, but not limited to, a mesh structure or a plate structure for supplying the second power supply voltage ELVSS to the pixel 100.

In an exemplary embodiment, the second power supply voltage (e.g., the low power supply voltage) ELVSS may have a voltage level substantially the same as a voltage level of the first power supply voltage (e.g., the high power supply voltage) ELVDD in a non-emission period including a data writing period, and may have a voltage level different from the voltage level of the first power supply voltage ELVDD in an emission period. In one exemplary embodiment, for example, the second power supply voltage ELVSS may be changed to a ground voltage at a start time point of the emission period. Thus, the emission period may be initiated when the second power supply voltage ELVSS may be changed from the voltage level of the first power supply voltage ELVDD to the ground voltage.

The scan voltage VSCAN applied to the scan line SL may have a turn-on voltage level while the data voltage VDATA is stored in the storage capacitor CST in the data writing period, may be changed from the turn-on voltage level to a first turn-off voltage level after the data voltage VDATA is stored in the storage capacitor CST in the data writing period, and may be further changed from the first turn-off voltage level to a second turn-off voltage level at the start time point of the emission period. In one exemplary embodiment, for example, the first turn-off voltage level may range from about 8 volts (V) to about 15 V, but not being limited thereto. In an exemplary embodiment, the second turn-off voltage level may be sufficiently high to turn off the switching transistor TSW, but may be lower than the first turn-off voltage level. In one exemplary embodiment, for example, the second turn-off voltage level may be, but not limited to, about 5 V. At the start time point of the emission period, since the scan voltage VSCAN is changed from the first turn-off voltage level to the second turn-off voltage level lower than the first turn-off voltage level, a voltage of the anode of the organic light emitting diode OLED may be decreased based on a coupling between the scan line SL and the anode by the anode discharging capacitor CAD. In one exemplary embodiment, for example, the voltage of the anode of the organic light emitting diode OLED may be decreased lower than a threshold voltage of the organic light emitting diode OLED at the start time point of the emission period. Accordingly, the pixel 100 may be effectively prevented from undesirably emitting light due to charges remaining in the anode even if a black data voltage (or 0-gray voltage) is applied as the data voltage VDATA to the pixel 100.

In a pixel having a two-transistor-one-capacitor ("2T1C") structure including the switching transistor TSW, the storage capacitor CST and the driving transistor TDR without the anode discharging capacitor CAD, although the second power supply voltage ELVSS is decreased to the ground voltage at the start time point of the emission period, the voltage of the anode of the organic light emitting diode OLED may be gradually decreased due to charges remaining in a parasitic capacitor between the anode and the cathode and/or a parasitic capacitor between the anode and other elements/wirings. Accordingly, in such a pixel having a 2T1C structure, even if a black data voltage is applied as the data voltage VDATA to the pixel having the 2T1C structure, the voltage of the anode and a voltage of the cathode may have a voltage difference greater than a threshold voltage of the organic light emitting diode OLED at the start time point of the emission period, and thus the organic light emitting diode OLED may undesirably emit light for a certain time.

However, as described above, in an exemplary embodiment of the pixel 100, the voltage of anode may be immediately decreased at the start time point of the emission period based on the coupling between the scan line SL and the anode by the anode discharging capacitor CAD, and thus the undesired light emission of the pixel 100 in response to the black data voltage may be effectively prevented.

Hereinafter, an operation of an exemplary embodiment of the pixel 100 of the organic light emitting diode display device will be described in detail with reference to FIGS. 2 through 5.

Figure 2:
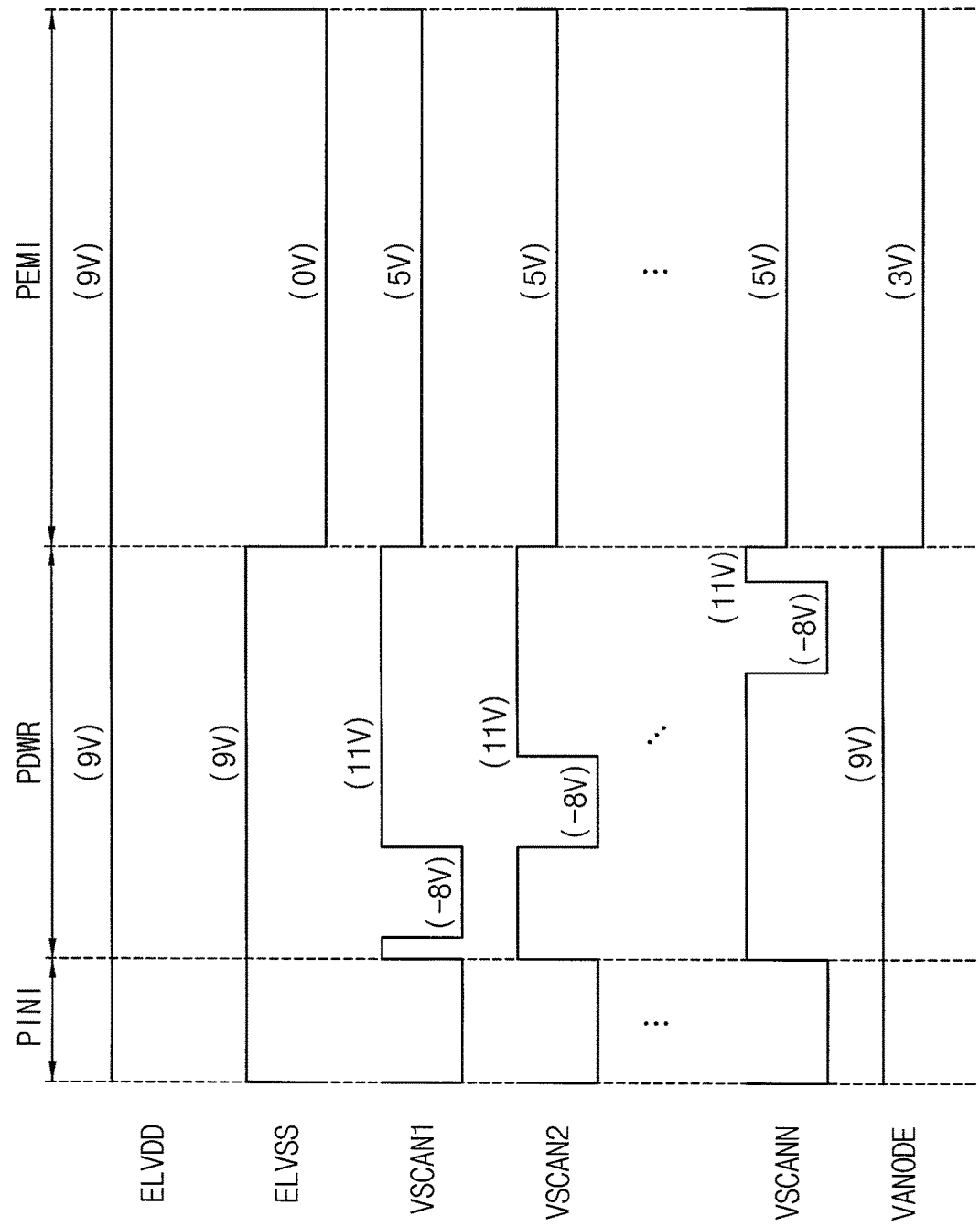
FIG. 2 is a timing diagram for describing an operation of a pixel of an organic light emitting diode display device according to an exemplary embodiment.
Figure 3:
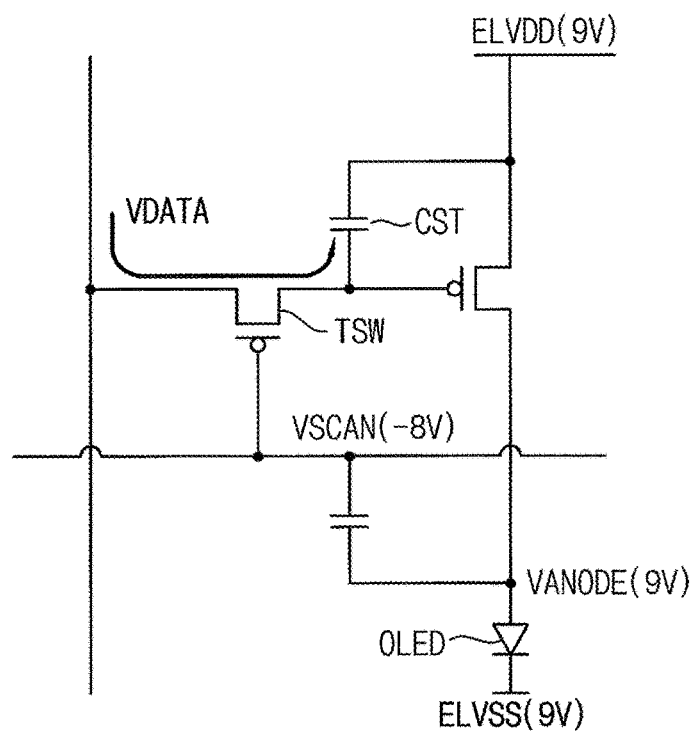
FIG. 3 is a circuit diagram for describing an operation of an exemplary embodiment of a pixel of an organic light emitting diode display device in a data writing period while a data voltage is stored in a storage capacitor.
Figure 4:
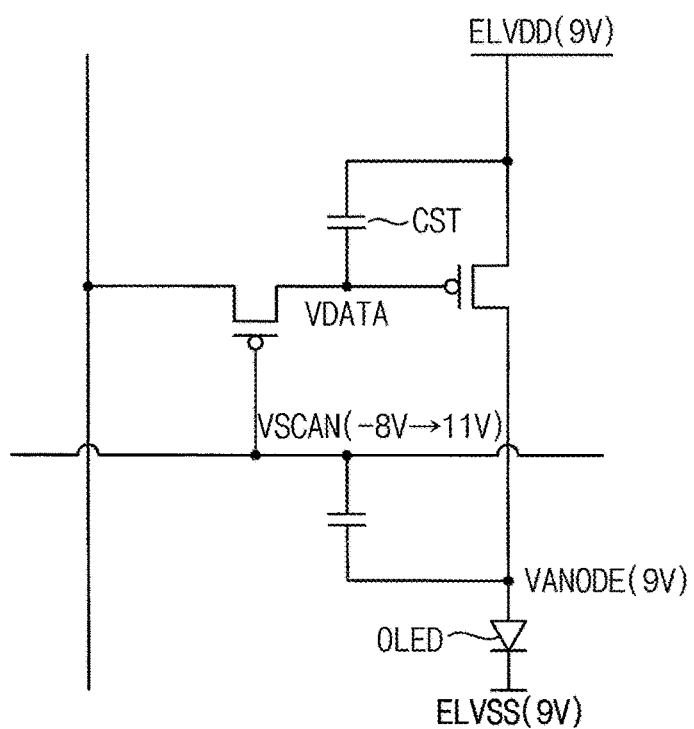
FIG. 4 is a circuit diagram for describing an operation of an exemplary embodiment of a pixel of an organic light emitting diode display device in a data writing period after a data voltage is stored in a storage capacitor.
Figure 5:
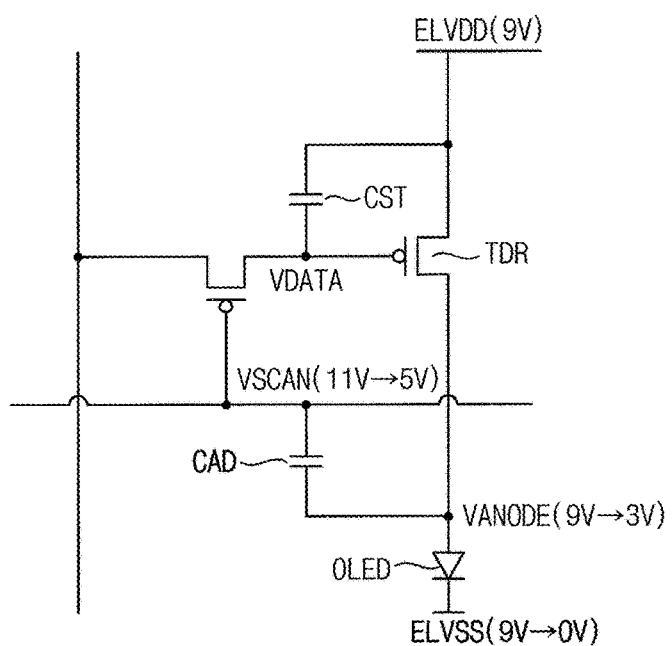
FIG. 5 is a circuit diagram for describing an operation of an exemplary embodiment of a pixel of an organic light emitting diode display device at a start time point of an emission period.

FIG. 2 is a timing diagram for describing an operation of an exemplary embodiment of a pixel of an organic light emitting diode display device, FIG. 3 is a circuit diagram for describing an operation of an exemplary embodiment of a pixel of an organic light emitting diode display device in a data writing period while a data voltage is stored in a storage capacitor, FIG. 4 is a circuit diagram for describing an operation of an exemplary embodiment of a pixel of an organic light emitting diode display device in a data writing period after a data voltage is stored in a storage capacitor, and FIG. 5 is a circuit diagram for describing an operation of an exemplary embodiment of a pixel of an organic light emitting diode display device at a start time point of an emission period.

Referring to FIG. 2, each frame period of an organic light emitting diode display device may include a data writing period PDWR and an emission period PEMI. In an exemplary embodiment, each frame period may further include, but not limited to, an initialization period PINI.

In the initialization period PINI, a plurality of scan voltages VSCAN1, VSCAN2 and VSCANN respectively applied to a plurality of scan lines included in the organic light emitting diode display device may substantially simultaneously have a turn-on voltage level (e.g., a low level). Accordingly, switching transistors of all pixels included in the organic light emitting diode display device may be turned on. Further, substantially the same data voltage (e.g., a black data voltage) may be applied to a plurality of data lines included in the organic light emitting diode display device in the initialization period PINI, and thus storage capacitors of all the pixels included in the organic light emitting diode display device may be substantially simultaneously initialized to store substantially the same data voltage having substantially the same voltage difference with a first power supply voltage.

In the data writing period PDWR, the plurality of scan voltages VSCAN1, VSCAN2 and VSCANN applied to the plurality of scan lines may sequentially have the turn-on voltage level of, for example, about −8 V. Accordingly, the switching transistors of the pixels may be sequentially turned on, on a row-by-row basis, and data voltages may be sequentially stored in the storage capacitors of the pixels on a row-by-row basis. In one exemplary embodiment, for example, as illustrated in FIG. 3, while a scan voltage VSCAN has the turn-on voltage level of, for example, about −8 V in the data writing period PDWR, a switching transistor TSW may be turned on to transfer a data voltage VDATA to a storage capacitor CST, and the storage capacitor CST may store the data voltage VDATA transferred by the switching transistor TSW at one electrode thereof.

Further, in the data writing period PDWR, each of the plurality of scan voltages VSCAN1, VSCAN2 and VSCANN may be activated to the turn-on voltage level, and then may be deactivated to a first turn-off voltage level of, for example, about 11 V. In one exemplary embodiment, for example, as illustrated in FIG. 4, in the data writing period PDWR, after the data voltage VDATA may be stored at one electrode of the storage capacitor CST, the scan voltage VSCAN may be changed from the turn-on voltage level to the first turn-off voltage level of, for example, about 11 V.

In a non-emission period including the data writing period PDWR (and the initialization period PINI), a second power supply voltage ELVSS may have a voltage level substantially the same as a voltage level (e.g., about 9 V) of a first power supply voltage ELVDD. Accordingly, in the non-emission period, no current flows from a line of the first power supply voltage ELVDD to a line of the second power supply voltage ELVSS, and thus an organic light emitting diode OLED may not emit light. Further, in the non-emission period including the data writing period PDWR, a voltage VANODE of an anode of the organic light emitting diode OLED between the line of the first power supply voltage ELVDD to the line of the second power supply voltage ELVSS may have the voltage level substantially the same as the voltage level (e.g., about 9 V) of the first and second power supply voltages ELVDD and ELVSS.

The second power supply voltage ELVSS having the voltage level substantially the same as that of the first power supply voltage ELVDD may be changed to have a predetermined voltage difference with respect to the first power supply voltage ELVDD, and thus the emission period PEMI may be initiated. In an exemplary embodiment, the second power supply voltage ELVSS may be a signal commonly applied to all of the pixels included in the organic light emitting diode display device, and thus the emission period PEMI for all of the pixels may be substantially simultaneously initiated.

Referring again to FIG. 2, at a start time point of the emission period PEMI, the plurality of scan voltages VSCAN1, VSCAN2 and VSCANN may be changed from the first turn-off voltage level to a second turn-off voltage level of, for example, about 5 V. Accordingly, the anode voltage VANODE of the organic light emitting diode OLED may be decreased based on a coupling between a scan line and the anode of the organic light emitting diode OLED by an anode discharging capacitor CAD. In one exemplary embodiment, for example, as illustrated in FIG. 5, the second power supply voltage ELVSS may be changed to a ground voltage, or 0 V to initiate the emission period PEMI. At the start time point of the emission period PEMI, once the scan voltage VSCAN is changed from the first turn-off voltage level of, for example, about 11 V to the second turn-off voltage level of, for example, about 5 V, the anode voltage VANODE may be immediately decreased (e.g., from about 9 V to about 3 V) lower than a threshold voltage of the organic light emitting diode OLED based on a coupling between the scan line and the anode of the organic light emitting diode OLED by the anode discharging capacitor CAD. If a data voltage VDATA is greater than or equal to a 1-gray voltage, a driving transistor TDR may generate a driving current, the anode voltage VANODE may be increased, and the organic light emitting diode OLED may emit light based on the driving current. However, as illustrated in FIG. 2, if the data voltage VDATA is a black data voltage corresponding to a 0-gray level, the anode voltage VANODE may be maintained lower than the threshold voltage of the organic light emitting diode OLED, and thus undesired light emission of the organic light emitting diode OLED may be effectively prevented.

Figure 6A:
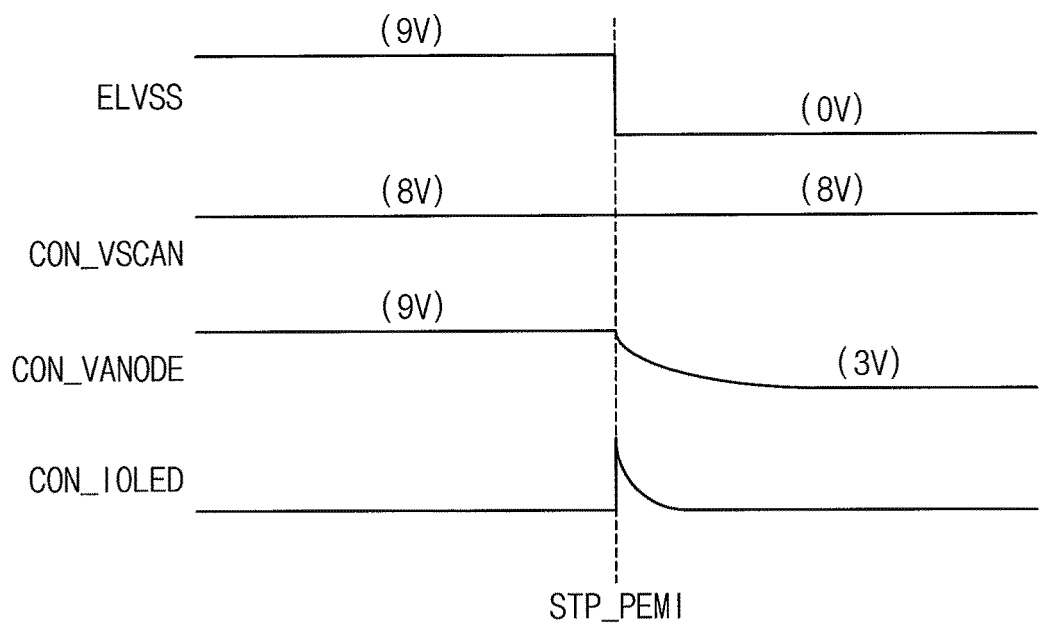
FIG. 6A is a timing diagram for describing an operation of a pixel having no anode discharging capacitor.
Figure 6B:
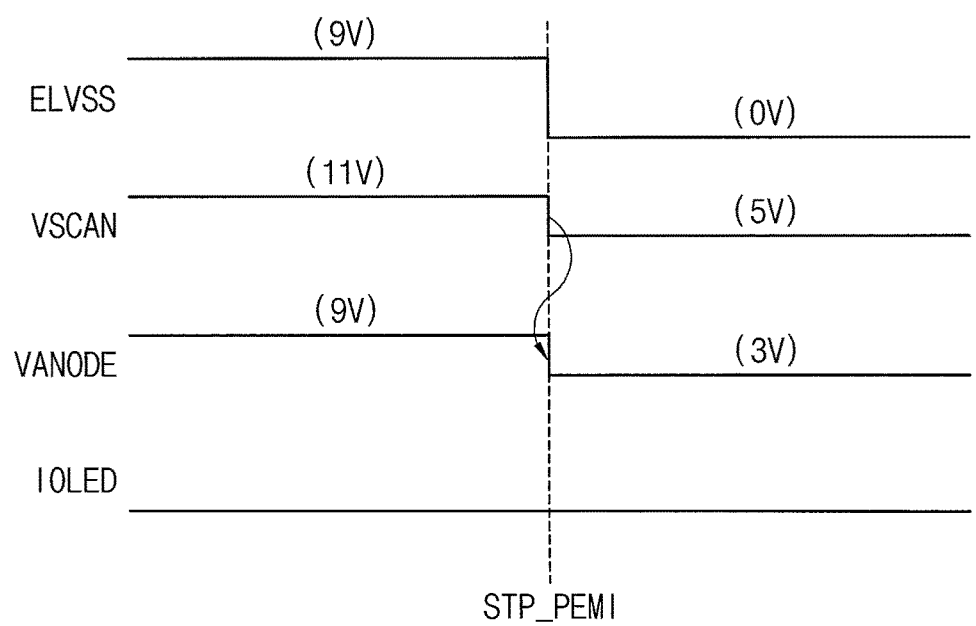
FIG. 6B is a timing diagram for describing an operation of a pixel including an anode discharging capacitor according to an exemplary embodiment.

FIG. 6A is a timing diagram for describing an operation of a pixel having no anode discharging capacitor, and FIG. 6B is a timing diagram for describing an operation of a pixel including an anode discharging capacitor according to an exemplary embodiment.

Referring to FIG. 6A, in a pixel having a 2T1C structure having no anode discharging capacitor, a scan voltage CON_SCAN may have a constant turn-off voltage level of, for example, about 8 V during periods before and after a start time point STP_PEMI of an emission period. Further, although a second power supply voltage ELVSS is changed from about 9 V to about 0 V at the start time point STP_PEMI of the emission period, an anode voltage CON_VANODE of an organic light emitting diode may be gradually decreased due to charges remaining in a parasitic capacitor. Accordingly, in a case where a black data voltage is applied to the pixel having the 2T1C structure, a current CON_IOLED may flow through the organic light emitting diode for a certain time from the start time point STP_PEMI of the emission period, and thus the pixel having the 2T1C structure may undesirably emit light.

However, referring to FIG. 6B, in a pixel having a 2T2C structure including an anode discharging capacitor according to an exemplary embodiment, at the start time point STP_PEMI of the emission period, a scan voltage VSCAN may be decreased from a first turn-off voltage level of, for example, about 11 V to a second turn-off voltage level of, for example, about 5 V, and an anode voltage VANODE may be immediately decreased to, for example, about 3 V lower than a threshold voltage of an organic light emitting diode based on a coupling between a scan line and an anode of the organic light emitting diode by the anode discharging capacitor. Accordingly, in a case where the black data voltage is applied to the pixel according to an exemplary embodiment, no current IOLED may flow through the organic light emitting diode, and the undesired light emission of the pixel in response to the black data voltage may be effectively prevented.

Figure 7:
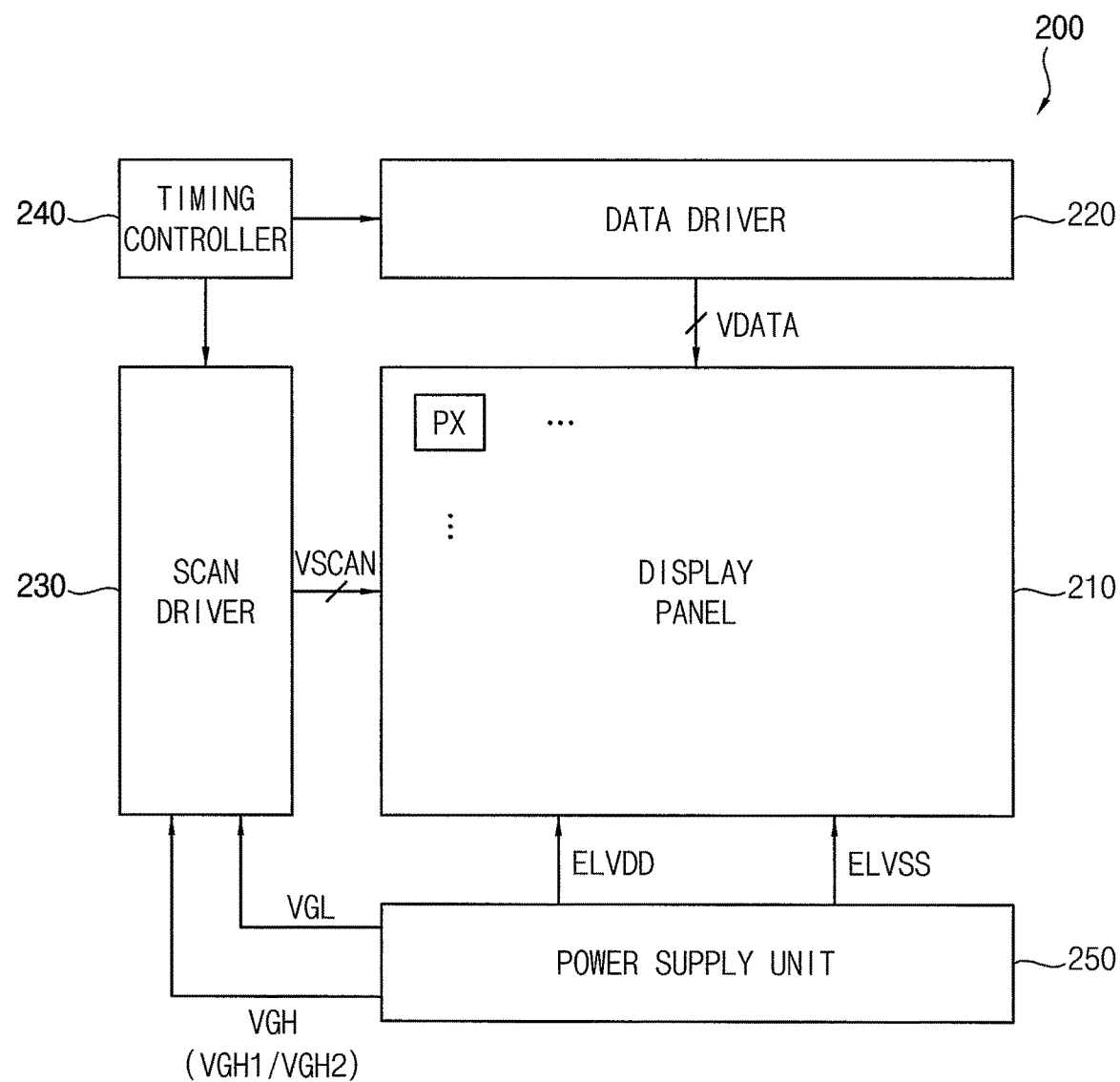
FIG. 7 is a block diagram illustrating an organic light emitting diode display device according to an exemplary embodiment.

FIG. 7 is a block diagram illustrating an organic light emitting diode display device according to an exemplary embodiment.

Referring to FIG. 7, an exemplary embodiment of an organic light emitting diode display device 200 may include a display panel 210 including a plurality of pixels PX, a data driver 220 which provides a data voltage VDATA to each of the plurality of pixels PX, a scan driver 230 which provides a scan voltage VSCAN to each of the plurality of pixels PX, and a timing controller 240 which controls the data driver 220 and the scan driver 230. In such an embodiment, the organic light emitting diode display device 200 may further include a power supply unit 250 which supplies a first power supply voltage ELVDD and a second power supply voltage ELVSS to the display panel 210, and supplies a gate on voltage (e.g., a low gate voltage) VGL and a gate off voltage (e.g., a high gate voltage) VGH to the scan driver 230. In such an embodiment, the data driver 220, the scan driver 230 and the timing controller 240 may be defined by a circuit, e.g., integrated circuit ("IC"), or a portion thereof.

The display panel 210 may include the plurality of pixels PX connected to a plurality of data lines and a plurality of scan lines. Each pixel PX may include a switching transistor which transfers the data voltage VDATA in response to the scan voltage VSCAN applied thereto through a corresponding scan line, a storage capacitor which stores the data voltage VDATA transferred by the switching transistor, a driving transistor which generates a driving current based on the data voltage VDATA stored in the storage capacitor, an organic light emitting diode which emits light based on the driving current, and an anode discharging capacitor connected between the scan line and an anode of the organic light emitting diode.

The power supply unit 250 may supply the first and second power supply voltages ELVDD and ELVSS having substantially the same voltage level to the display panel 210 in a data writing period. To initiate an emission period, the power supply unit 250 may change the second power supply voltage ELVSS at a start time point of the emission period such that the first and second power supply voltages ELVDD and ELVSS have different voltage levels from each other. In an exemplary embodiment, at the start time point of the emission period, the power supply unit 250 may change the gate off voltage VGH1 having a first turn-off voltage level provided to the scan driver 230 to the gate off voltage VGH2 having a second turn-off voltage level. In such an embodiment, the second turn-off voltage level may be sufficiently high to turn off the switching transistor, but may be lower than the first turn-off voltage level.

In a data writing period, while the data voltage VDATA is stored in the storage capacitor, the scan driver 230 may output the scan voltage VSCAN having a turn-on voltage level based on the gate on voltage VGL. Further, in the data writing period, after the data voltage VDATA is stored in the storage capacitor, the scan driver 230 may output the scan voltage VSCAN having the first turn-off voltage level based on the gate off voltage VGH1 having the first turn-off voltage level. In the emission period, the scan driver 230 may output the scan voltage VSCAN having the second turn-off voltage level based on the gate off voltage VGH2 having the second turn-off voltage level. That is, the scan driver 230 may change the scan voltage VSCAN from the first turn-off voltage level to the second turn-off voltage level lower than the first turn-off voltage level at a start time point of the emission period. Accordingly, a voltage of the anode of the organic light emitting diode may be decreased at the start time point of the emission period based on a coupling between the scan line and the anode of the organic light emitting diode by the anode discharging capacitor, and thus, undesired light emission of the pixel PX may be effectively prevented.

Figure 8:
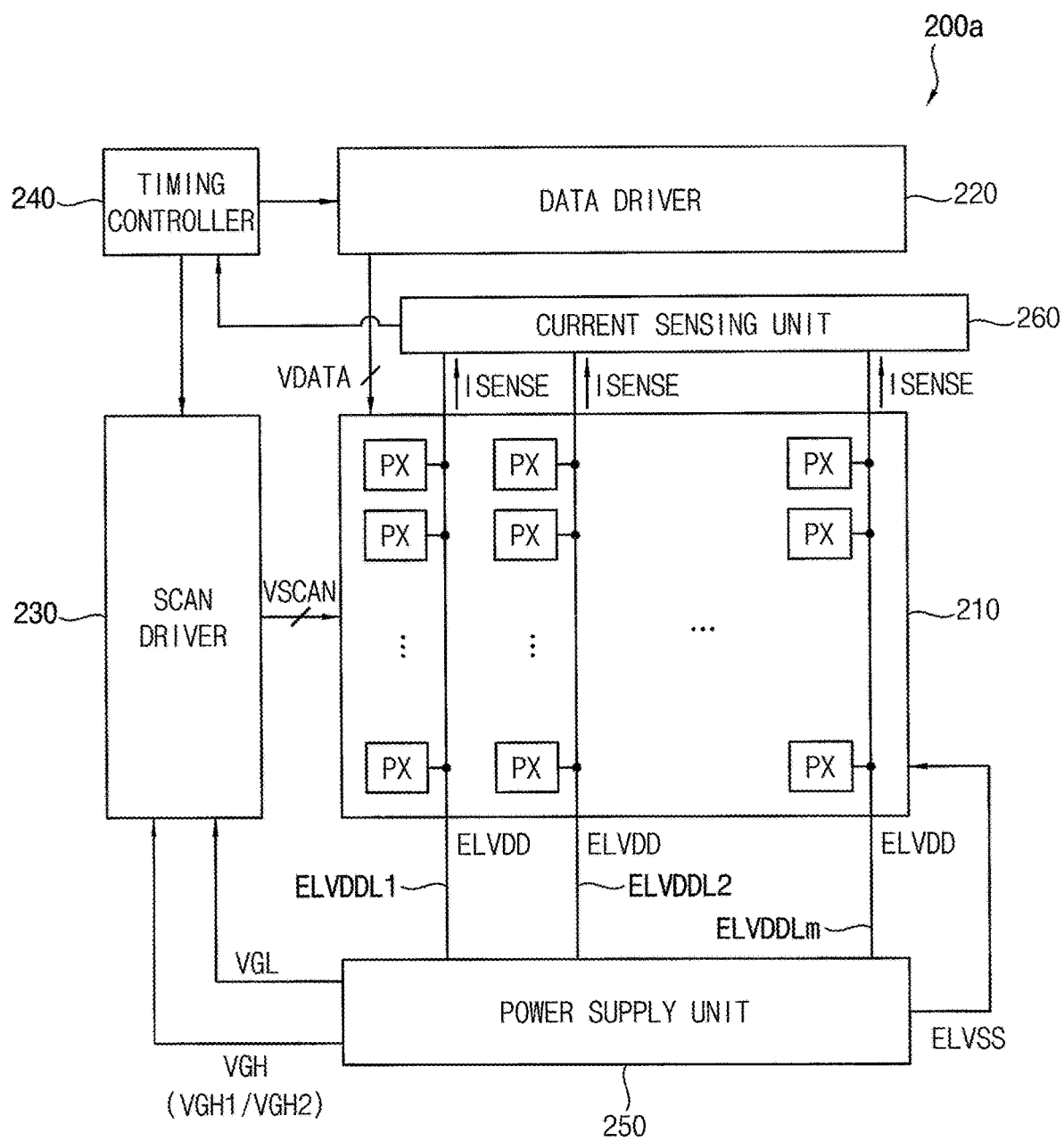
FIG. 8 is a block diagram illustrating an organic light emitting diode display device according to an exemplary embodiment.

FIG. 8 is a block diagram illustrating an organic light emitting diode display device according to an exemplary embodiment.

The organic light emitting diode display device 200a of FIG. 8 may have substantially the same configurations and operations as the organic light emitting diode display device 200 of FIG. 7, except that a first power supply voltage ELVDD may be supplied to a plurality of pixels PX through a plurality of power supply voltage lines ELVDDL1, ELVDDL2 and ELVDDLm spaced apart from each other, and that the organic light emitting diode display device 200a may further include a current sensing unit 260. The same or like elements shown in FIG. 8 have been labeled with the same reference characters as used above to describe an exemplary embodiment of the organic light emitting diode display device 200 shown in FIG. 7, and any repetitive detailed description thereof will hereinafter be omitted or simplified.

In such an embodiment, a power supply unit 250 may supply the first power supply voltage ELVDD to the plurality of pixels PX through the plurality of power supply voltage lines ELVDDL1, ELVDDL2 and ELVDDLm extending in parallel with data lines. In such an embodiment, the plurality of power supply voltage lines ELVDDL1, ELVDDL2 and ELVDDLm may be spaced apart from each other, and may be electrically disconnected from each other.

The current sensing unit 260 may detect sensing currents ISENSE generated by (driving transistors of) the plurality of pixels PX when a sensing voltage (e.g., a middle gray voltage) is applied as a data voltage VDATA through the plurality of power supply voltage lines ELVDDL1, ELVDDL2 and ELVDDLm. In an exemplary embodiment, the current sensing unit 260 may provide sensing information about the sensing currents ISENSE to a timing controller 240, the timing controller 240 may correct image data to compensate for threshold voltage deviations of the driving transistors of the plurality of pixels PX based on the sensing information, and the data driver 220 may provide the plurality of pixels PX with the corrected data voltage VDATA where the threshold voltage deviations are compensated based on the corrected image data.

Figure 9:
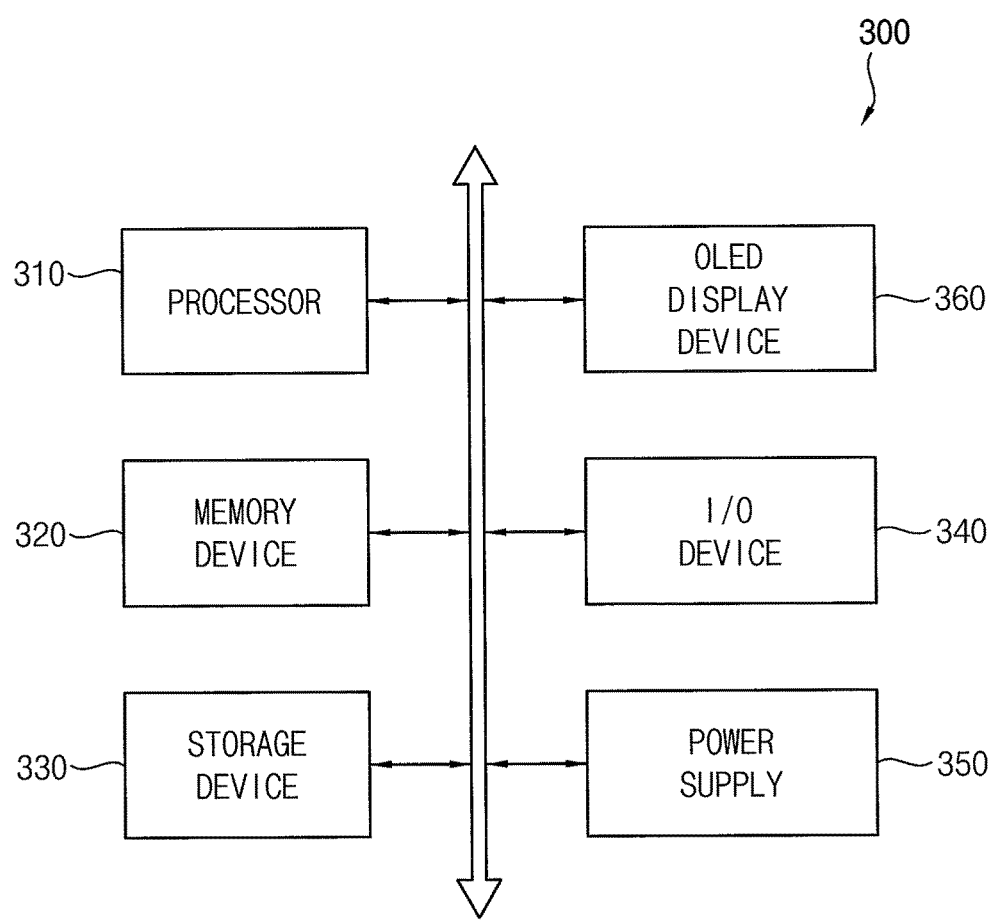
FIG. 9 is a block diagram illustrating an electronic device including an organic light emitting diode display device according to an exemplary embodiment.

FIG. 9 is a block diagram illustrating an electronic device including an organic light emitting diode display device according to an exemplary embodiment.

Referring to FIG. 9, an exemplary embodiment of an electronic device 300 may include a processor 310, a memory device 320, a storage device 330, an input/output ("I/O") device 340, a power supply 350, and an organic light emitting diode ("OLED") display device 360. The electronic device 300 may further include a plurality of ports for communicating a video card, a sound card, a memory card, a universal serial bus ("USB") device, other electric devices, etc.

The processor 310 may perform various computing functions. The processor 310 may be an application processor ("AP"), a micro processor, a central processing unit ("CPU"), etc. The processor 310 may be coupled to other components via an address bus, a control bus, a data bus, etc. In an exemplary embodiment, the processor 310 may be further coupled to an extended bus such as a peripheral component interconnection ("PCI") bus.

The memory device 320 may store data for operations of the electronic device 300. In one exemplary embodiment, for example, the memory device 320 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc, and/or at least one volatile memory device such as a dynamic random access memory ("DRAM") device, a static random access memory ("SRAM") device, a mobile DRAM device, etc.

The storage device 330 may be a solid state drive ("SSD") device, a hard disk drive ("HDD") device, a CD-ROM device, etc. The I/O device 340 may be an input device such as a keyboard, a keypad, a mouse, a touch screen, etc, and an output device such as a printer, a speaker, etc. The power supply 350 may supply power for operations of the electronic device 300.

In an exemplary embodiment, as described above, the OLED display device 360 may include a plurality of pixels, and each pixel may include an anode discharging capacitor connected between a scan line and an anode of an OLED. Accordingly, a voltage of the anode may be decreased at a start time point of an emission period based on a coupling between the scan line and the anode by the anode discharging capacitor, and thus, undesired light emission of the pixel in response to a black data voltage may be effectively prevented.

According to an exemplary embodiment, the electronic device 300 may be any electronic device including the OLED display device 360, such as a cellular phone, a smart phone, a tablet computer, a wearable device, a personal digital assistant ("PDA"), a portable multimedia player ("PMP"), a digital camera, a music player, a portable game console, a navigation system, a digital television, a 3D television, a personal computer ("PC"), a home appliance, a laptop computer, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A pixel of an organic light emitting diode display device, the pixel comprising:
   a switching transistor which transfers a data voltage in response to a scan voltage applied thereto through a scan line;
   a storage capacitor which stores the data voltage transferred thereto by the switching transistor;
   a driving transistor which generates a driving current based on the data voltage stored in the storage capacitor;
   an organic light emitting diode which emits light based on the driving current; and
   an anode discharging capacitor connected directly between the scan line and an anode of the organic light emitting diode,
   wherein a gate of the driving transistor is not directly connected to the anode discharging capacitor, and
   wherein the scan line is directly connected to both of a gate of the switching transistor and one electrode of the anode discharging capacitor.

2. The pixel of claim 1, wherein
   the scan voltage has a turn-on voltage level while the data voltage is stored in the storage capacitor in a data writing period,
   the scan voltage is changed from the turn-on voltage level to a first turn-off voltage level after the data voltage is stored in the storage capacitor in the data writing period, and
   the scan voltage is further changed from the first turn-off voltage level to a second turn-off voltage level at a start time point of an emission period.

3. The pixel of claim 2, wherein the second turn-off voltage level is lower than the first turn-off voltage level.

4. The pixel of claim 2, wherein a voltage of the anode of the organic light emitting diode is decreased at the start time point of the emission period based on a coupling between the scan line and the anode of the organic light emitting diode by the anode discharging capacitor.

5. The pixel of claim 4, wherein the voltage of the anode of the organic light emitting diode is decreased lower than a threshold voltage of the organic light emitting diode at the start time point of the emission period.

6. The pixel of claim 1, wherein the pixel has a two-transistor-two capacitor structure with the switching transistor, the driving transistor, the storage capacitor and the anode discharging capacitor.

7. The pixel of claim 1, wherein
   the organic light emitting diode is connected to the driving transistor and a low power supply voltage line, and
   a low power supply voltage supplied through the low power supply voltage line has a voltage level substantially the same as a voltage level of a high power supply voltage in a data writing period, and is changed to a ground voltage in an emission period.

8. A pixel of an organic light emitting diode display device, the pixel comprising:
   a switching transistor including: a source connected to a data line; a drain; and a gate connected to a scan line;
   a storage capacitor connected between a first power supply voltage line and the drain of the switching transistor;
   a driving transistor including: a source connected to the first power supply voltage line; a drain; and a gate connected to the storage capacitor;
   an organic light emitting diode including an anode connected to the drain of the driving transistor, and a cathode connected to a second power supply voltage line; and
   an anode discharging capacitor connected directly between the scan line and the anode of the organic light emitting diode,
   wherein the gate of the driving transistor is not directly connected to the anode discharging capacitor, and
   wherein the scan line is directly connected to both of the gate of the switching transistor and one electrode of the anode discharging capacitor.

9. The pixel of claim 8, wherein a scan voltage applied to the scan line is changed from a first turn-off voltage level to a second turn-off voltage level at a start time point of an emission period.

10. The pixel of claim 9, wherein the second turn-off voltage level is lower than the first turn-off voltage level.

11. The pixel of claim 9, wherein a voltage of the anode of the organic light emitting diode is decreased at the start time point of the emission period based on a coupling between the scan line and the anode of the organic light emitting diode by the anode discharging capacitor.

12. The pixel of claim 11, wherein the voltage of the anode of the organic light emitting diode is decreased lower than a threshold voltage of the organic light emitting diode at the start time point of the emission period.

13. The pixel of claim 8, wherein the pixel has a two-transistor-two capacitor structure with the switching transistor, the driving transistor, the storage capacitor and the anode discharging capacitor.

14. The pixel of claim 8, wherein
   a second power supply voltage supplied through the second power supply voltage line has a voltage level substantially the same as a voltage level of a first power supply voltage supplied through the first power supply voltage line in a data writing period, and
   the second power supply voltage is changed to a ground voltage in an emission period.

15. An organic light emitting diode display device, comprising:
   a display panel including a plurality of pixels;
   a data driver which provides a data voltage to each of the plurality of pixels;
   a scan driver which provides a scan voltage to each of the plurality of pixels; and
   a timing controller which controls the data driver and the scan driver,
   wherein each of the plurality of pixels comprises:
      a switching transistor which transfers the data voltage in response to the scan voltage applied thereto through a scan line;

a storage capacitor which stores the data voltage transferred by the switching transistor;

a driving transistor which generates a driving current based on the data voltage stored in the storage capacitor;

an organic light emitting diode which emits light based on the driving current; and an anode discharging capacitor connected directly between the scan line and an anode of the organic light emitting diode, wherein a gate of the driving transistor is not directly connected to the anode discharging capacitor, and wherein the scan line is directly connected to both of a gate of the switching transistor and one electrode of the anode discharging capacitor.

16. The organic light emitting diode display device of claim 15, further comprising:

a power supply unit which supplies a first power supply voltage and a second power supply voltage to the display panel, and supplies a gate on voltage and a gate off voltage to the scan driver, wherein, in a data writing period, the power supply unit supplies the first and second power supply voltages having substantially a same voltage level to the display panel, and wherein, at a start time point of an emission period, the power supply unit changes the second power supply voltage in a way such that the first and second power supply voltages have different voltage levels from each other, and changes the gate off voltage from a first turn-off voltage level to a second turn-off voltage level.

17. The organic light emitting diode display device of claim 16, wherein the second turn-off voltage level is lower than the first turn-off voltage level.

18. The organic light emitting diode display device of claim 16, wherein the scan driver outputs the scan voltage having a turn-on voltage level based on the gate on voltage while the data voltage is stored in the storage capacitor in a data writing period, the scan driver outputs the scan voltage having the first turn-off voltage level based on the gate off voltage having the first turn-off voltage level after the data voltage is stored in the storage capacitor in the data writing period, and the scan driver outputs the scan voltage having the second turn-off voltage level based on the gate off voltage having the second turn-off voltage level in the emission period.

19. The organic light emitting diode display device of claim 18, wherein a voltage of the anode of the organic light emitting diode is decreased at the start time point of the emission period based on a coupling between the scan line and the anode of the organic light emitting diode by the anode discharging capacitor.

20. The organic light emitting diode display device of claim 15, further comprising:

a power supply unit which supplies a power supply voltage to the plurality of pixels through a plurality of power supply voltage lines spaced apart from each other; and a current sensing unit which detects sensing currents through the plurality of power supply voltage lines, wherein the sensing currents are generated by the plurality of pixels when a sensing voltage is applied thereto as the data voltage.

* * * * *